United States Patent
Miyazaki

(10) Patent No.: US 8,674,713 B2
(45) Date of Patent: Mar. 18, 2014

(54) ZERO AMPERE LEVEL CURRENT DATA CORRECTION FOR A POWER DEVICE UNDER TEST

(75) Inventor: Tsuyoshi Miyazaki, Saitama (JP)

(73) Assignee: Tektronix, Inc., Beaverton, OR (US)

( * ) Notice: Subject to any disclaimer, the term of this patent is extended or adjusted under 35 U.S.C. 154(b) by 338 days.

(21) Appl. No.: 13/236,562

(22) Filed: Sep. 19, 2011

(65) Prior Publication Data

US 2012/0098556 A1  Apr. 26, 2012

Related U.S. Application Data

(60) Provisional application No. 61/405,530, filed on Oct. 21, 2010.

(51) Int. Cl.
*G01R 1/00* (2006.01)
*G01R 13/22* (2006.01)

(52) U.S. Cl.
USPC .................................. 324/750.01; 324/121 R

(58) Field of Classification Search
None
See application file for complete search history.

(56) References Cited

U.S. PATENT DOCUMENTS

| | | | |
|---|---|---|---|
| 6,377,037 B1 * | 4/2002 | Burns et al. ................... | 324/142 |
| 6,829,152 B2 | 12/2004 | Miura et al. | |
| 6,885,183 B2 | 4/2005 | Kato | |
| 6,975,951 B1 * | 12/2005 | Sutrave et al. ................ | 702/106 |
| 7,598,724 B2 | 10/2009 | Howell et al. | |
| 2011/0156698 A1 * | 6/2011 | Cook ............................ | 324/127 |

* cited by examiner

*Primary Examiner* — Vinh Nguyen
(74) *Attorney, Agent, or Firm* — William K. Bucher; Marger Johnson & McCollom PC

(57) ABSTRACT

An apparatus and method corrects for zero ampere level current fluctuations in a current signal. First and second acquisition circuitry generate respective current and voltage data samples of the current signal. Current fluctuation data samples representative of zero ampere level deviations of the current signal are extracted corresponding to Off-periods of the current signal. The current fluctuation data samples of the Off-periods are interpolated to generate current fluctuation data samples representative of zero ampere level deviations of the On-periods of the current signal. The Off-period and On-period current fluctuation data samples are subtracted from the current data samples of the current signal to generate corrected zero ampere level current data samples.

4 Claims, 10 Drawing Sheets

ZERO AMPERE LEVEL CURRENT DATA CORRECTION FOR A POWER DEVICE UNDER TEST

BACKGROUND OF THE INVENTION

The present invention relates generally to measuring current from device under test and more specifically to correcting current data of a power device under test using a current sensor.

A current sensor such as a Rogowski coil, air-cored coil, etc. is suitable for detecting large currents because of its flexibility. A large current is sometime carried by a thick metal bus bar. If the metal bus bar is intricately wired, it would be difficult to locate a desired line under test of the bus bar at a position for detecting a current through the line with a current sensor. A flexible Rogowski coil allows a user to make a loop around the line under test.

FIG. 1 is a schematic block diagram of a current sensor 22 having a Rogowski coil 12 and an integrator circuit 20 usable in a current probe. The Rogowski coil 12 has a detecting coil 11 and a conducting return wire 9 that are made of a wire. A portion of the wire is formed in loops to produce the detecting coil 11. The return wire 9 has one end 9b connected to the loop end 12b of the detecting coil 11 and is folded back through the center of the detecting coil 11 to the loop beginning end 12a of the detecting coil 11. The loop beginning end 12a of the detecting coil 11 and the free end 9a of the return wire 9 are closely located. In addition, when a user conducts a measurement, the ends 12a and 12b of the detecting coil 11 are arranged to be physically close together so that the detecting coil 11 constitute a magnetic closed loop around a line under test 10. The loop beginning end 12a of the detecting coil 11 is coupled to the integrator circuit 20 that typically has a resister 14, a capacitor 16 and an operational amplifier 18. The free end 9a of the conducting return wire 9 is coupled to ground.

A current Ip flowing in the line under test 10 generates magnetic flux that induces a voltage in the Rogowski coil 12. If the frequency of the current Ip becomes higher, the induced voltage also becomes higher. The integrator circuit 20 maintains a flat frequency characteristic by lowering the gain of the integrator circuit 20 as the frequency of the current Ip increases. U.S. Pat. No. 7,598,724 by Howell et al. and U.S. Pat. No. 6,885,183 by Kato disclose some applications of a Rogowski coil.

FIG. 2 is a partial schematic diagram of a device under test showing the use of Rogowski coil sensor 70 for measuring a current signal. The device under test in FIG. 2 is an IGBT (Insulated Gate Bipolar Transistor) 40 in inverter circuitry for driving an inductive load, or a three-phase motor 46. The inverter circuitry has a plurality of IGBTs 30, 32, 34, 36, 38, and 40 which have respective flywheel diodes 50, 52, 54, 56, 58, and 60. Since the three-phase motor 46 is an inductive load, it stores energy in the inductance and regenerates a flywheel current that passes through the flywheel diodes 50, 52, 54, 56, 58, and 60. A power supply 48 provides power to the inverter circuitry. A PWM (Pulse Width Modulation) controller 44 is coupled to an IGBT driver 42 via a bus to provide a PWM control signal. The IGBT driver 42 provides gate drive voltages to the IGBTs 30, 32, 34, 36, 38, and 40. The pulse width of the gate drive voltages is modulated according to the PWM control signal.

The positive and negative inputs of a differential probe 62 are coupled to the collector and emitter of the IGBT 40 respectively to detect a voltage, Vce, between the collector and emitter. The output of the differential probe 62 may be connected to a first channel (CH1) of a digital oscilloscope 66. The positive and negative inputs of a differential probe 64 are coupled to the gate and emitter of the IGBT 40 respectively to detect a voltage, Vge, between the gate and emitter or a gate drive voltage. The output of the differential probe 64 may be connected to a third channel (CH3) of the oscilloscope 66. A current probe 68 may use a Rogowski coil 70 and integrator circuit 72 to detect an emitter current Ie of the IGBT 40. The output of the current probe 68 is coupled to a second channel (CH2) of the oscilloscope. The digital oscilloscope 66 receives the current and voltage signals from the device under test and stores the signals as digital data for display as waveforms.

FIG. 3 shows voltage and current waveforms of the three channels of the oscilloscope 66. The horizontal and vertical axes are respectively amplitude and time. The time axis of display area A is longer than that of display area B. That is, the voltage and current waveforms of the display area B are zoomed-in version of the voltage and current waveform portions indicated by a box 74 in the display area A. Each pulse of the voltage and current waveforms of CH1 and CH2 shows a surge at the rising edge.

FIG. 4 shows the voltage and current waveforms of the three channels that corresponding to the display area A of FIG. 3 wherein the vertical axis is enlarged relative to that of the display area A of FIG. 3. The current waveform of the second channel shown in FIG. 4 has positive half-cycles and negative half-cycles. The current waveform shows current flowing in the emitter of IBGT 40 during the positive half cycle as a result of the gate drive voltage turning IBGT 40 On and Off using pulse width modulation. During the negative half-cycle, current is drawn through the flywheel diode 60 to the motor 46.

Referring again to the current waveform of the second channel of FIG. 4, an arrow 76 indicates zero ampere level of the current waveform at the left end of the waveform in the display area. FIG. 4 shows that the zero ampere level of the current waveform fluctuates because the integration process in the integrator circuit 72 is not ideal. The fluctuation leads to a measurement error of power. For example, referring to FIG. 3, when the gate drive voltage is low, the IGBT 40 is off and then the collector-emitter voltage Vce is high and the emitter current Ie should be zero. That is, when the IGBT 40 is off, the power loss of the IGBT, or Vce×Ie should be zero. However, the power loss Vcex Ie may shows some value due to the fluctuation error.

AC type current probes, such as a current probe using a Rogowski coil cannot detect DC components in a current signal. What is needed is an apparatus and method that can cancel the fluctuation components at a zero ampere level even though the DC component cannot be detected.

SUMMARY OF THE INVENTION

The present invention is an apparatus for correcting current data samples corresponding to a current signal from a device under test. The apparatus has first acquisition circuitry receiving a current signal from a device under test for generating current data samples corresponding to the current signal and second acquisition circuitry receiving a voltage signal from the device under test corresponding to the current signal for generating voltage data samples corresponding to the voltage signal. The apparatus has a controller that receives the current data samples and voltage data samples and extracts current fluctuation data samples representative of deviations of the current data samples from a zero ampere level, the current fluctuation data samples corresponding to off-periods of the device under test as derived by detecting corresponding off-periods of the device under test in the voltage data samples, generating current fluctuation data samples corresponding to on-periods of the device under test by interpolating the current fluctuation data samples corresponding to the off-periods of the device under test, subtracting the current fluctuation data samples corresponding to the off-periods and the on-periods of the device under test from the current data samples representing the current signal to generate corrected zero ampere level current data samples, and generating a waveform display using the corrected zero ampere level current data values. The apparatus may also have a user interface for designating a threshold voltage level for the voltage data samples for detecting the off-periods in the device under test.

The above apparatus provides a platform for implementing a method for correcting current data samples representative of a current signal from a device under test. The method includes a step of receiving a current signal using a current sensor coupled to a device under test and generating current data samples representative of the current signal from the device under test. A voltage signal corresponding to the current signal from the device under test is received using a voltage probe and voltage data samples are generated representative of the voltage signal. Current fluctuation data samples representative of deviations of the current data samples from a zero ampere level are extracted with the current fluctuation data samples corresponding to off-periods of the device under test as derived by detecting corresponding off-periods of the device under test in the voltage data samples. The current fluctuation data samples of the off-periods of the device under test are interpolated to generate current fluctuation data samples corresponding to on-periods of the device under test. The current fluctuation data samples corresponding to the off-periods and the on-periods of the device under test are subtracted from the current data samples representing the current signal to generate corrected zero ampere level current data samples with the corrected zero ampere level current data samples being displayed.

The current sample correcting method has additional steps of designating an error cancel range around the zero ampere level of the corrected zero ampere level current data samples, and modifying the corrected zero ampere level current data samples by changing the corrected zero ampere level current data samples within the error cancel range to zero.

The objects, advantages and novel features of the present invention are apparent from the following detailed description when read in conjunction with appended claims and attached drawings.

DETAILED DESCRIPTION OF THE INVENTION

Figure 1:
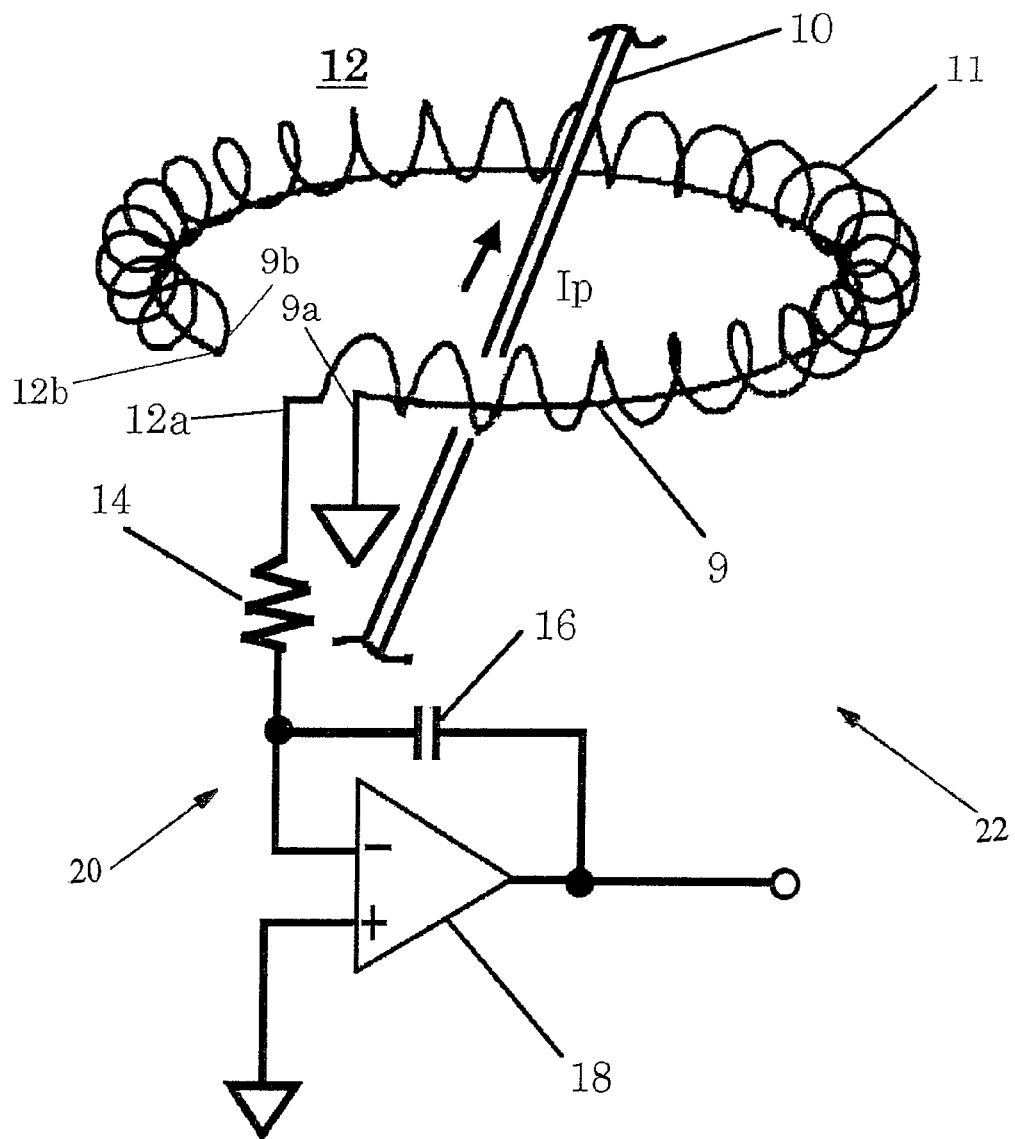
FIG. 1 is a conventional current sensor using a Rogowski coil with an integrator.
Figure 2:
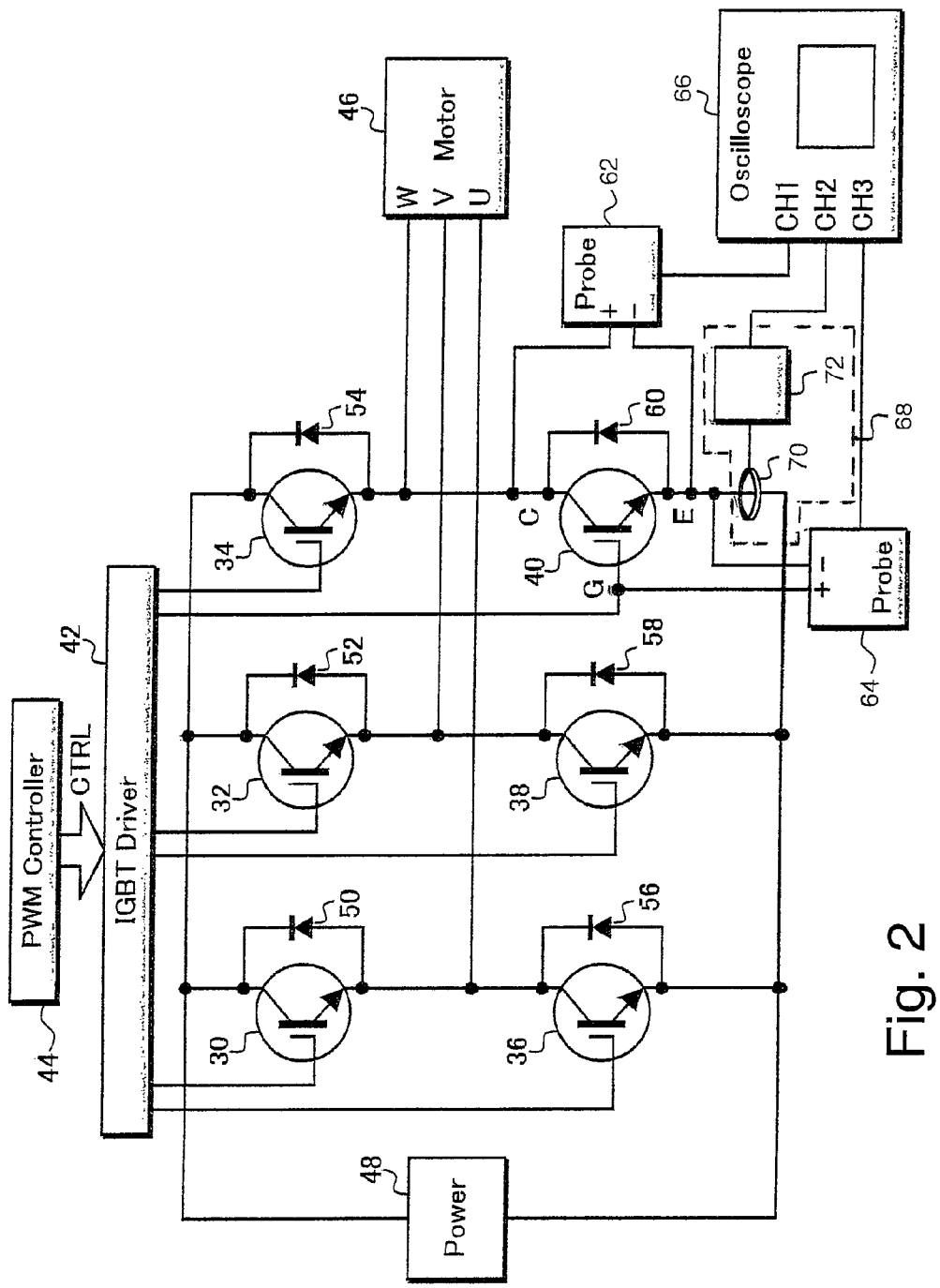
FIG. 2 is a block diagram of an inverter circuitry for driving a motor and a setup for measuring a current and voltages of an IGBT with an oscilloscope.
Figure 5:
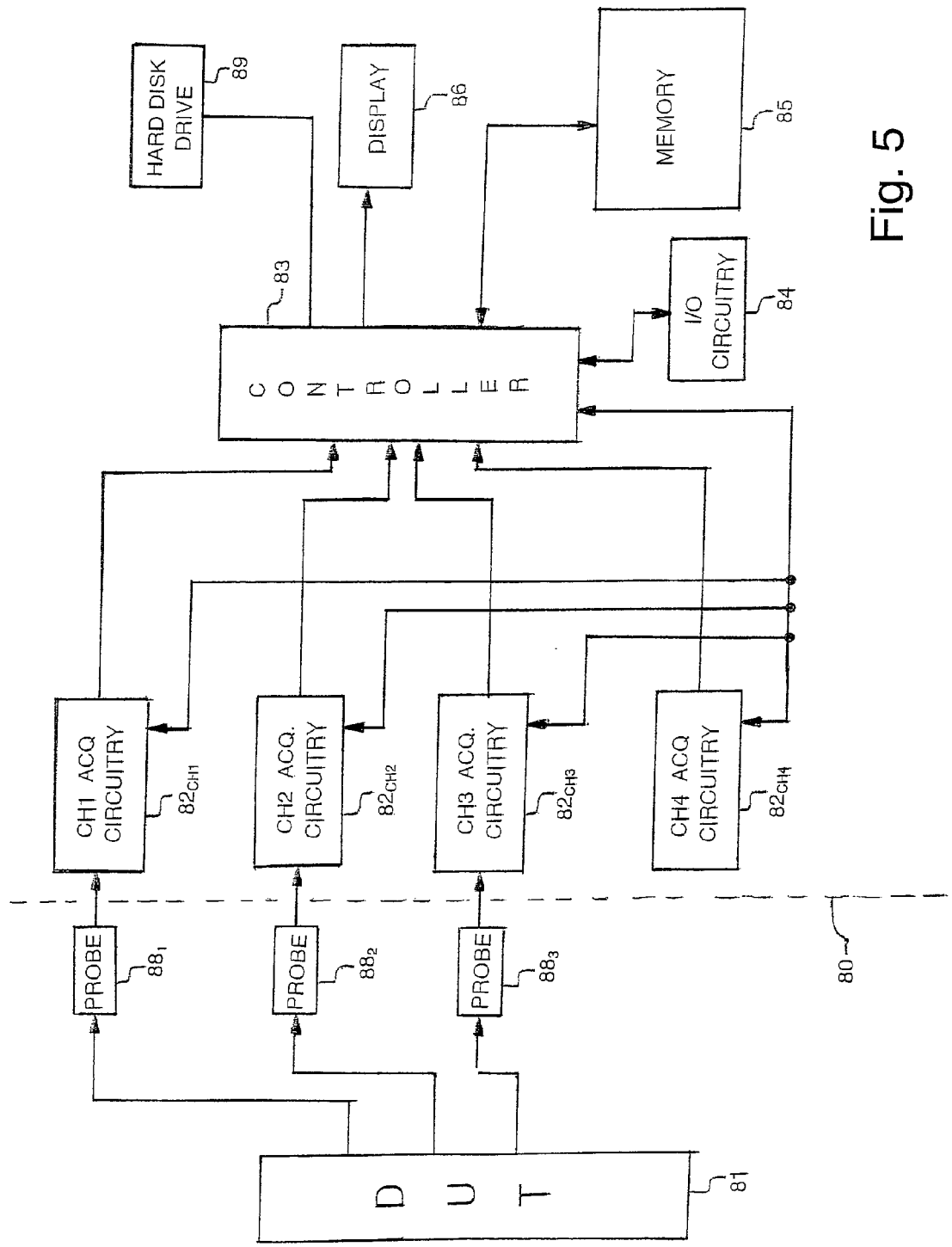
FIG. 5 is a block diagram of a measurement apparatus, such as an oscilloscope, for correcting current measurements from a device under test according to the present invention.

FIG. 5 is a block diagram of an oscilloscope 80 for correcting current measurements from a device under test (DUT) 81 according to the present invention. The oscilloscope 80 has multiple input channels CH1, CH2, CH3 and CH4 with each input channel having acquisition circuitry $82_{CH1}$ $82_{CH2}$, $82_{CH3}$, and $82_{CH4}$. The output of each acquisition circuit $82_{CH1}$ $82_{CH2}$, $82_{CH3}$, and $82_{CH4}$ is coupled to a controller 83. The controller 83 is coupled to I/O circuitry 84, memory 85, a display device 86, such as a liquid crystal display, cathode ray tube or the like, and a mass storage device 89, such as a hard disk drive, thumb drive, compact disk, or the like. The mass storage device may store program instructions for operating the oscilloscope 80 as well as program instructions for performing steps for correcting current measurements from the device under test (DUT) 81 according to the present invention. The DUT 81, such as the inverter circuitry of FIG. 2, is coupled to the input channels $82_{CH1}$ $82_{CH2}$, $82_{CH3}$ via signal acquisition probes $88_1$, $88_2$, and $88_3$ that respectively correspond to differential probe 62, current probe 68 and differential probe 64 in FIG. 2.

Each of the channel acquisition circuitry $82_{CH1}$ $82_{CH2}$, $82_{CH3}$, and $82_{CH4}$ includes, illustratively, input conditioning circuitry, such as an input amplifier, analog-to-digital conversion circuitry, trigger circuitry supporting acquisition memory, and the like. The supporting acquisition memory may be a portion of the memory 85. Acquisition circuitry $82_{CH1}$ $82_{CH2}$, $82_{CH3}$, and $82_{CH4}$ operate to digitize one or more of the signals from the DUT 81 to produce one or more respective digital data sample streams suitable for use by the controller 83. Acquisition circuitry $82_{CH1}$ $82_{CH2}$, $82_{CH3}$, and $82_{CH4}$ in response to commands received from controller 83, change trigger conditions, decimator functions, and other acquisition related parameters. Each of the acquisition circuitry $82_{CH1}$ $82_{CH2}$, $82_{CH3}$, and $82_{CH4}$ couples its respective digital data sample streams to the controller 83.

The controller 83 includes processor circuitry, support circuitry and memory to process the received digital data sample streams to generate waveform data for presentation on the display device 86. The processor circuitry cooperates with the support circuitry, such as power supplies, clock circuits, cache memory, and the like, as well as circuits that assist in executing software routines stored in memory 85. As such, it is contemplated that some of the process steps discussed herein as software processes may be implemented within hardware, for example, as circuitry that cooperates with processor circuitry to perform various steps. Controller 83 also interfaces with input/output (I/O) circuitry 84. For example, I/O circuitry 84 may comprise a keypad, pointing device, touch screen, or other means adapted to provide user input and output to the controller 83. Controller 83, in response to such user input, adapts the operations of the acquisition circuitry $82_{CH1}$ $82_{CH2}$, $82_{CH3}$, and $82_{CH4}$ to perform various data acquisitions, triggering, processing, and display communications, among other functions.

Memory 85 may include volatile memory, such as SRAM, DRAM, among other volatile memories. Memory 85 may also include non-volatile memory devices, such as a disk drive or a tape medium, among others, or programmable memory, such as an EPROM, among others.

Although controller 83 of FIG. 5 is depicted as a general purpose computer that is programmed to perform various control functions in accordance with the present invention, the invention may be implemented in hardware such as, for example, an application specific integrated circuit (ASIC). As such, it is intended that the processor circuitry, as described herein, be broadly interpreted as being equivalently performed by hardware, software, or by a combination thereof.

Figure 6:
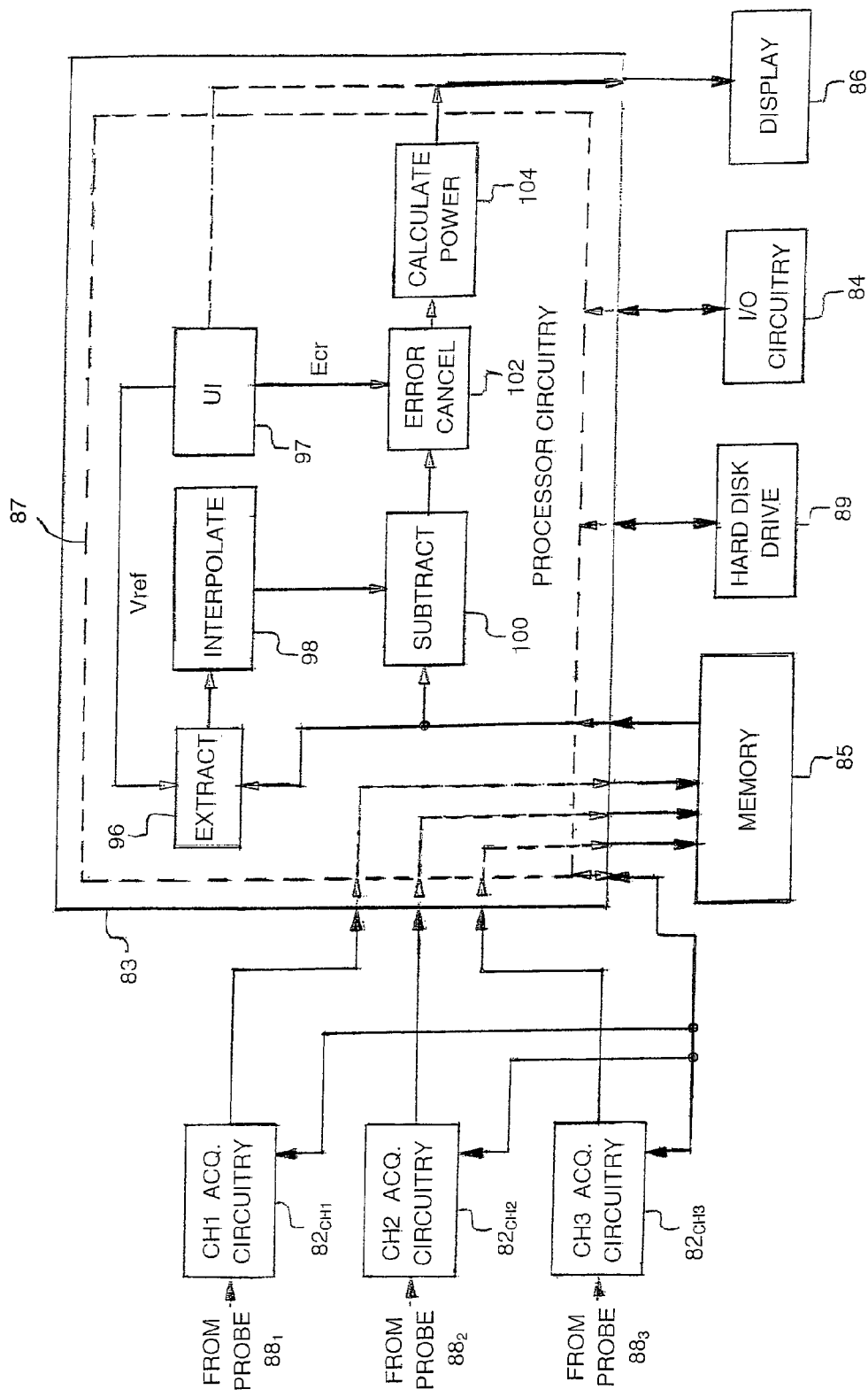
FIG. 6 is a block diagram illustrating functions performed by the measurement apparatus controller for correcting current measurements from a device under test according to the present invention.

Referring to FIG. 6, there is shown a block diagram of the oscilloscope 80 from FIG. 5 having processing blocks in a processor circuitry block 87 of the controller 83 illustrating steps for correcting current measurements from a device under test (DUT) 81 according to the present invention. The oscilloscope 80 in FIG. 6 shows CH1 acquisition circuitry $82_{CH1}$ receiving a voltage signal via differential voltage probe $88_1$ corresponding to probe 62 in FIG. 2. CH2 acquisition circuitry $82_{CH2}$ receives a current signal from the current probe $88_2$ corresponding to probe 68 in FIG. 2. CH3 acquisition circuitry $82_{CH3}$ receives a current signal from the differential voltage probe $88_3$ corresponding to probe 64 in FIG. 2. Each voltage and current signal is amplified, digitized and stored as voltage data samples or current data samples in a circulating buffer memory of each respective acquisition circuitry $82_{CH1}$, $82_{CH2}$, $82_{CH3}$.

Figure 7A:
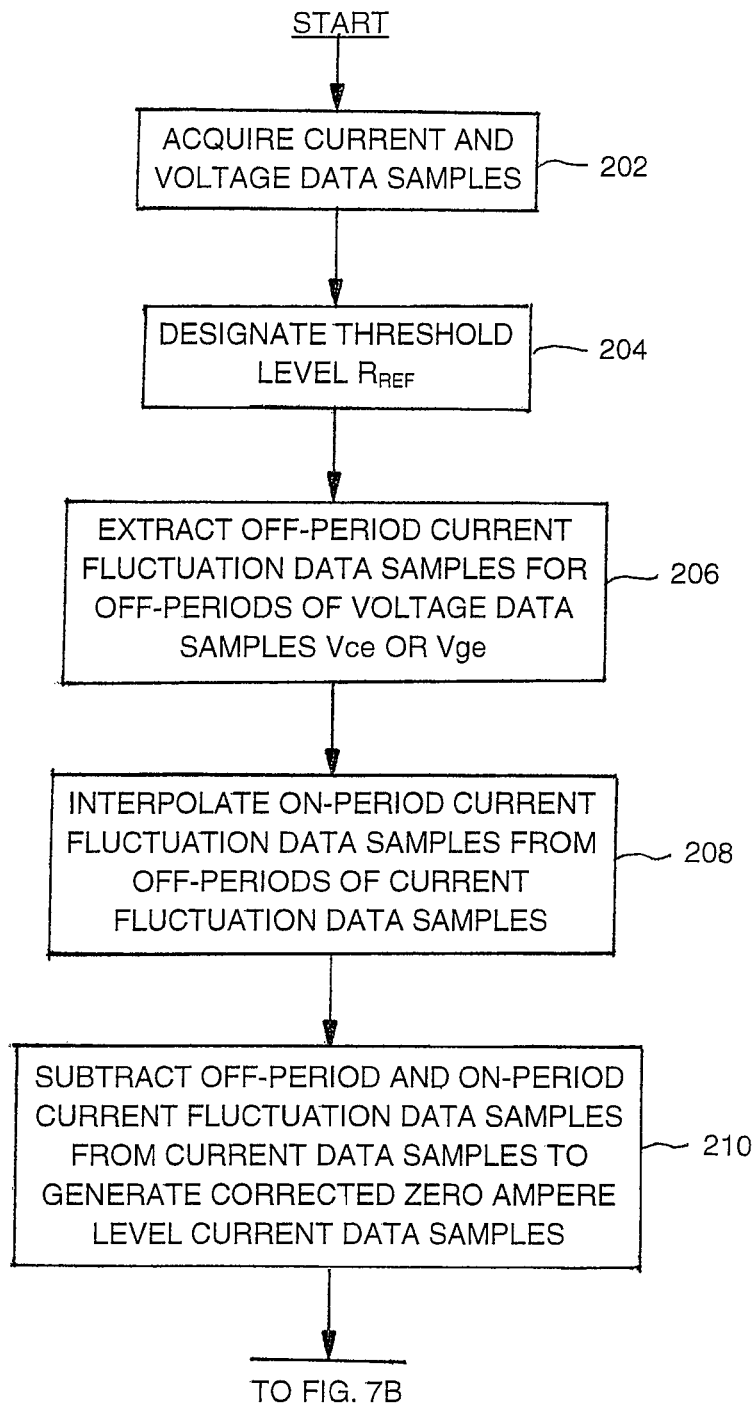
FIG. 7 is a flowchart for correcting current measurements from a device under test according to the present invention.
Figure 7B:
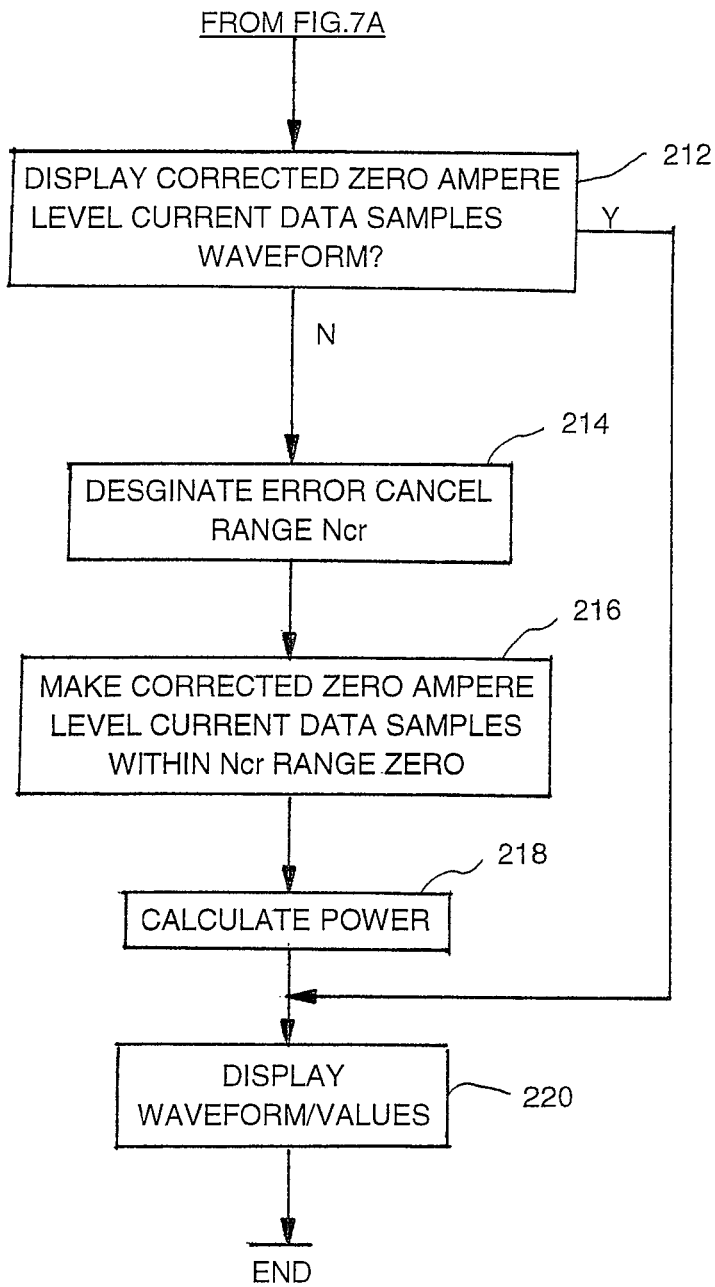

Referring to FIG. 7, there is shown a flow chart representative of the steps for correcting current measurements from a device under test according to the present invention. The respective voltage data samples and current data samples generated in each of the respective acquisition circuitry $82_{CH1}$, $82_{CH2}$, $82_{CH3}$ are captured in each of the respective circulating buffer memories according to a trigger signal when a trigger condition is satisfied as represented by step 202. The captured voltage data samples and current data samples are coupled to the controller 83 and stored in memory 85. A threshold level voltage $V_{ref}$ may be designated by a user through a user interface 97 displayed on display 86 or retrieving a previously stored threshold level voltage $V_{ref}$ as shown in step 204. The threshold level $V_{ref}$ may be designated for the voltage Vce between the collector and emitter or the gate drive voltage Vge between the gate and emitter of IGBT 40 to determine On or Off periods of the IGBT 40.

Figure 3:
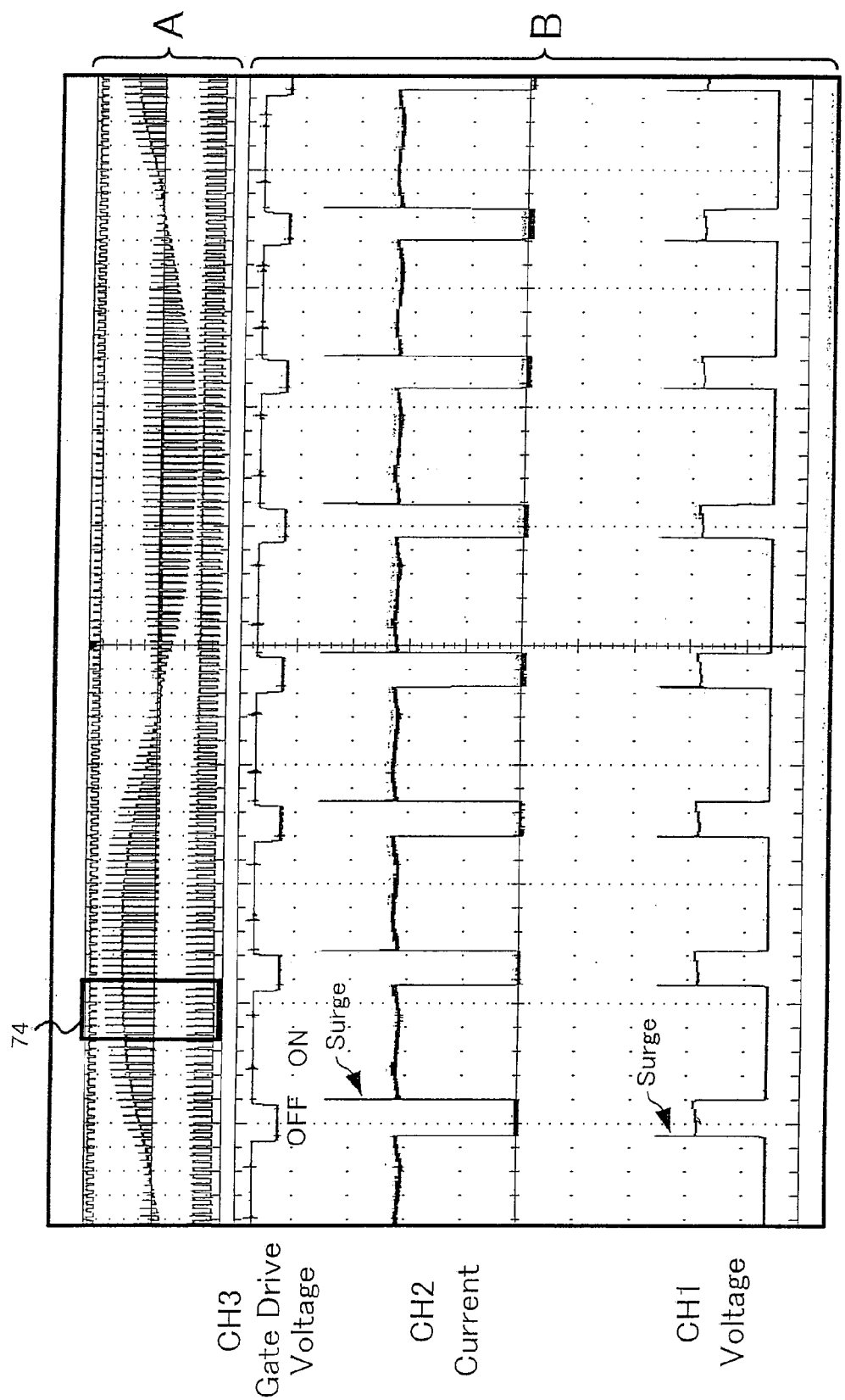
FIG. 3 shows measured current and voltage waveforms of an IGBT according to the measurement setup according to FIG. 2.
Figure 4:
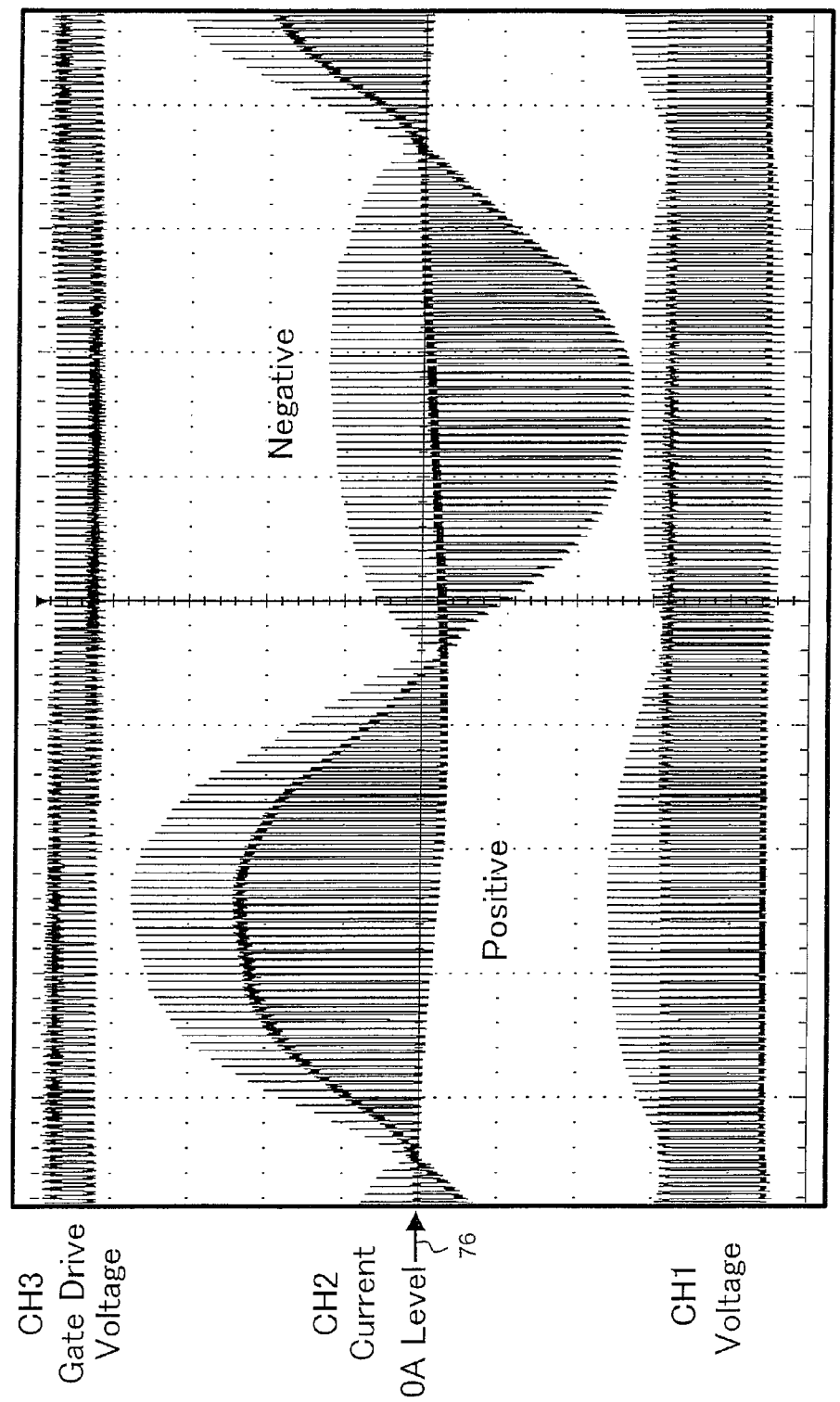
FIG. 4 shows measured current and voltage waveforms displayed in a display area A of FIG. 3 of which vertical axis is enlarged relative to that of the display area A of FIG. 3.

The current data samples and the voltage data samples are provided to an extraction block 96 in FIG. 6 for extracting current fluctuation data samples from the acquired current data samples. The current fluctuation data samples correspond to Off-periods and On-periods of the IGBT 40 and represent deviations of the current data samples from a zero ampere level. The current fluctuation data samples for Off-periods of the current data samples are derived by detecting corresponding Off-periods of the Vce or Vge voltage data samples as shown in step 206. Preferably, a central portion of each Off-period of the voltage Vce or Vge is detected and the corresponding portion of the Off-period current data sample is extracted as current fluctuation data sample. As shown in FIG. 3, the current signal of the Off-periods corresponds to zero ampere level having current fluctuations.

Figure 8:
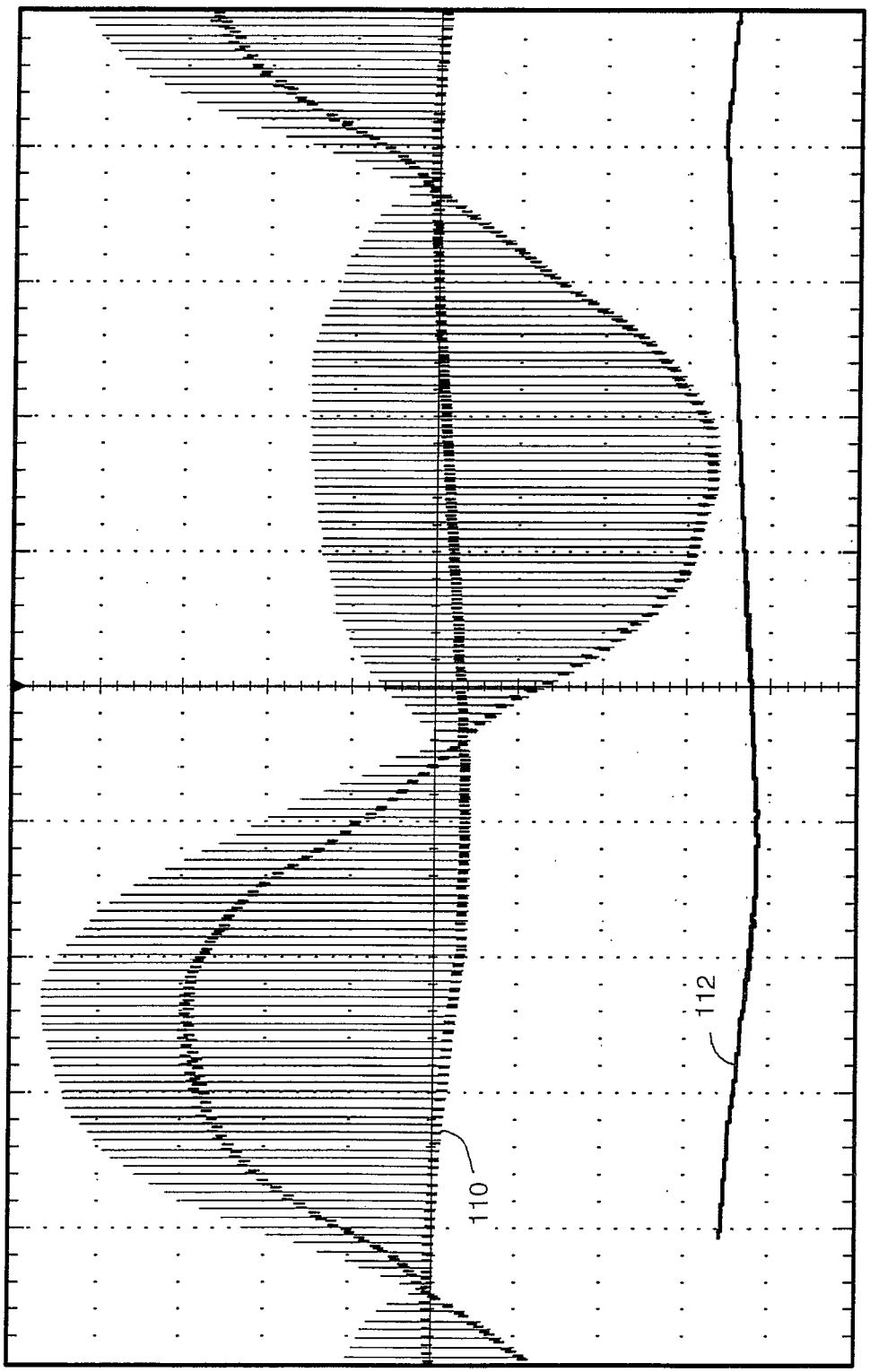
FIG. 8 shows a current waveform having zero ampere level current fluctuations and a current waveform representative of zero ampere level current fluctuation data samples.

The current fluctuation data samples for the OFF-periods are provided to an interpolation block 98 in FIG. 6 for extracting zero ampere level current fluctuation data samples for On-period of the IGBT 40. As shown in FIG. 3, the current data samples of the On-periods are high so that a DC component of the current signal cannot be extracted. A $\sin(x)/x$ function may be used on the Off-period current fluctuation data samples to generate the On-period current fluctuation data samples as shown in step 208. Alternatively, the Off-period current fluctuation data samples are interpolated for the On-periods by simply connecting between them with linear lines. FIG. 8 the current waveform 110 at the emitter of IGBT 40 having zero ampere level current fluctuations and a current waveform 112 representative of the current fluctuation data samples.

Figure 9:
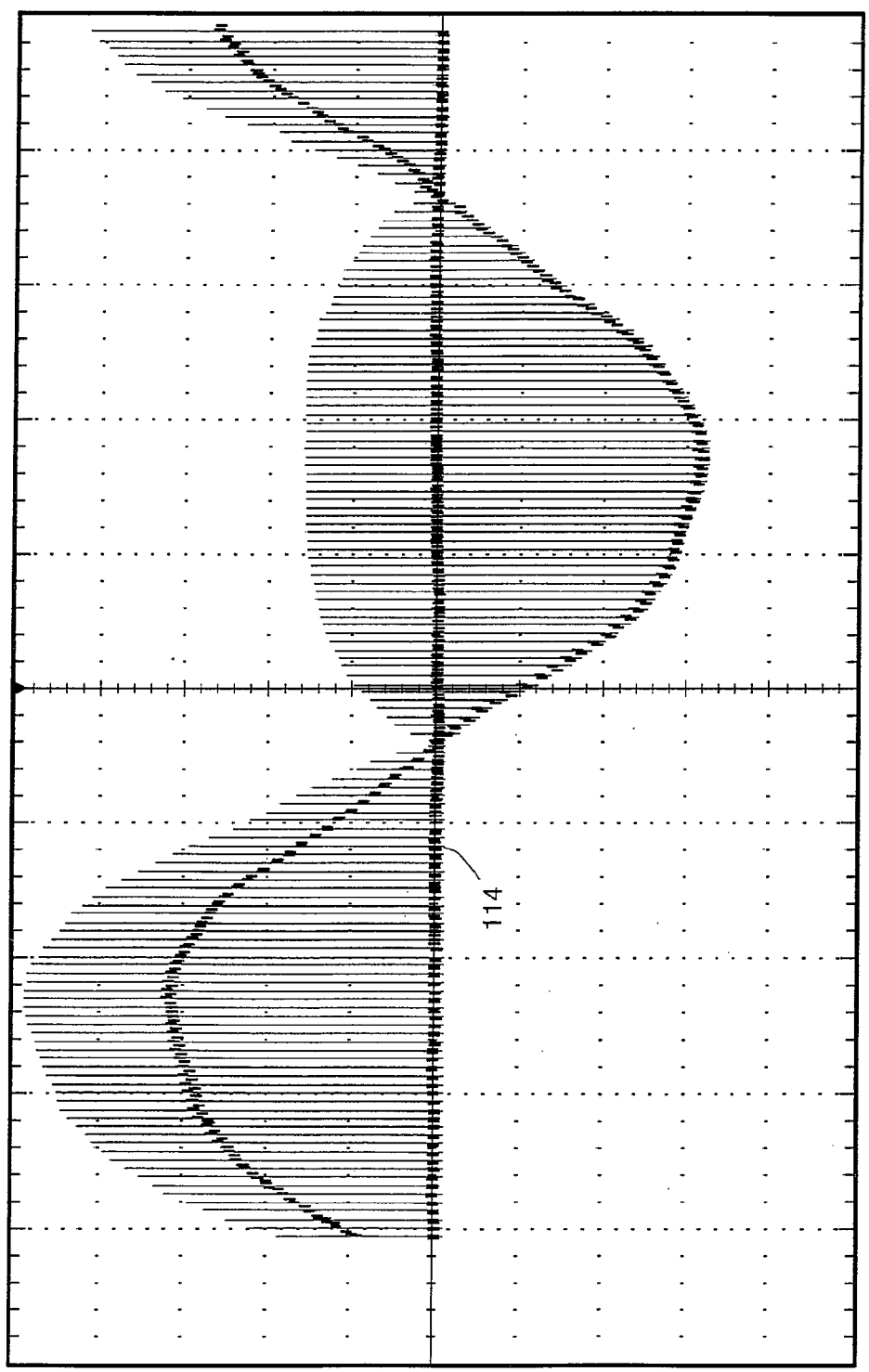
FIG. 9 shows a corrected current waveform having a corrected zero ampere level.

The Off-period and On-period current fluctuation data samples are provided to a subtraction block 100 along with the current data samples representative of the current signal at the emitter of IGBT 40. The subtraction block 100 subtracts the Off-period and On-period zero ampere level current fluctuation data samples from the original current data samples to generate corrected current data samples as shown in step 210 and representatively shown by the corrected current waveform 114 in FIG. 9. The corrected zero ampere level current data samples may be stored in memory 85 for further processing by the controller 83 or displayed as a waveform on display 86 as shown by the decision step 212.

The corrected zero ampere level current data samples sometime have white noise and/or offset errors. The white noise is mainly due to noise of the current sensor 62 with the integrator circuit 64 and internal noise of the digital oscilloscope 71. The offset error is mainly due to the interpolated On-period zero ampere current fluctuation data samples may not be ideal. To cancel the noise and/or offset errors, a user may designate a noise cancel range Ncr around the zero ampere level through the user interface 97 as represented in step 214. The noise cancel range Ncr may be +/−5% of the current amplitude around the zero ampere level, for example. However, it depends on characteristics of a device under test. The noise cancel range Ncr may be designated using an absolute value Nacr, that is, Ncr is from −Nacr to +Nacr. In this case, noise/offset canceled current data Y is:

$$Y = y \times \text{IF}(y > Nacr, 1, 0) + y \times \text{IF}(y < -Nacr, 1, 0)$$

"y" represents the corrected zero ampere level current data samples. "IF (y>Nacr, 1, 0)" means if y>Nacr is true, it is 1 but if not it is 0. "IF (y<−Nacr, 1, 0)" is similar. This process modifies the corrected zero ampere level current data samples within the noise cancel range Ncr zero to cancel the white noise and/or offset errors around the zero level as shown in step 216.

Then, a calculate power block 104 calculates power by multiplying Ie data and Vce data according to program stored in the mass storage device 89 as shown in step 218. For example, conduction power loss of the IGBT 40 may be evaluated by multiplying Ie data and Vce data. The conduction power loss arises due to that the collector-emitter voltage Vce is not zero even during the On-periods. Note that the conduction power loss can be evaluated more accurately since the corrected zero ampere level current data samples are corrected. Also, the corrected zero ampere level current data samples during the Off-period are revised to zero. The calculated power values and modified corrected zero ampere level current data samples may be displayed on a screen of the display 86 as shown in step 220.

Although particular embodiments have been described, it will be appreciated that the principles of the invention are not limited to those embodiments. Variations and modifications may be made without departing from the principles of the invention as set forth in the following claims.

What is claimed is:

1. A method for correcting current data samples representative of a current signal from a device under test comprising steps of:
- receiving the current signal using a current sensor coupled to the device under test and generating the current data samples representative of the current signal from the device under test;
- receiving a voltage signal corresponding to the current signal from the device under test using a voltage probe and generating voltage data samples representative of the voltage signal;
- extracting current fluctuation data samples representative of deviations of the current data samples from a zero ampere level, the current fluctuation data samples corresponding to off-periods of the device under test as derived by detecting corresponding off-periods of the device under test in the voltage data samples;
- interpolating the current fluctuation data samples of the off-periods of the device under test for generating current fluctuation data samples corresponding to on-periods of the device under test;
- subtracting the current fluctuation data samples corresponding to the off-periods and the on-periods of the device under test from the current data samples representing the current signal to generate corrected zero ampere level current data samples; and
- generating a waveform display using the corrected zero ampere level current data samples.

2. The method for correcting the current data samples representative of a current signal from a device under test as recited in claim 1 further comprising steps of:
- designating an error cancel range around the zero ampere level of the corrected zero ampere level current data samples; and
- modifying the corrected zero ampere level current data samples by changing the corrected zero ampere level current data samples within the error cancel range to zero.

3. An apparatus for correcting current data samples representative of a current signal from a device under test comprising:
- first acquisition circuitry receiving the current signal from the device under test and generating the current data samples representative of the current signal;
- second acquisition circuitry receiving a voltage signal from the device under test corresponding to the current signal and generating voltage data samples representative of the voltage signal; and
- a controller receiving the current data samples and voltage data samples and extracting current fluctuation data representative of deviations of the current data samples from a zero ampere level, the current fluctuation data samples corresponding to off-periods of the device under test as derived by detecting corresponding off-periods of the device under test in the voltage data samples, generating current fluctuation data samples corresponding to on-periods of the device under test by interpolating the current fluctuation data samples corresponding to the off-periods of the device under test, subtracting the current fluctuation data samples corresponding to the off-periods and the on-periods of the device under test from the current data samples representing the current signal to generate corrected zero ampere level current data samples, and generating a waveform display using the corrected zero ampere level current data samples.

4. The apparatus for correcting current data samples representative of a current signal from a device under test as recited in claim 3 further comprising a user interface for designating a threshold voltage level for the voltage data samples for detecting the off-periods in the device under test.

* * * * *